(12) United States Patent  
Chern (10) Patent No.: US 9,660,659 B2  
(45) Date of Patent: May 23, 2017

(54) APPARATUS FOR CORRECTING GAIN ERROR OF ANALOG-TO-DIGITAL CONVERTER

(71) Applicant: SK Hynix Memory Solutions Inc., San Jose, CA (US)

(72) Inventor: Jenn-Gang Chern, Redwood City, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 15/154,741

(22) Filed: May 13, 2016

(65) Prior Publication Data

US 2016/0336948 A1    Nov. 17, 2016

Related U.S. Application Data

(60) Provisional application No. 62/161,034, filed on May 13, 2015.

(51) Int. Cl.
| | |
|---|---|
| H03M 1/06 | (2006.01) |
| G05F 3/16 | (2006.01) |
| H03M 1/12 | (2006.01) |
| H03M 1/00 | (2006.01) |
| H03K 17/22 | (2006.01) |
| H03M 1/46 | (2006.01) |

(52) U.S. Cl.
CPC ............ *H03M 1/0604* (2013.01); *G05F 3/16* (2013.01); *H03K 17/223* (2013.01); *H03M 1/00* (2013.01); *H03M 1/12* (2013.01); *H03M 1/468* (2013.01)

(58) Field of Classification Search
CPC ......... H03M 1/00; H03M 1/12; H03K 17/223
USPC ......... 341/118, 120, 155, 156; 327/142, 143
See application file for complete search history.

(56) References Cited

U.S. PATENT DOCUMENTS

| | | | |
|---|---|---|---|
| 8,072,247 B1 * | 12/2011 | Wright | ...................... G06F 1/24 327/143 |
| 8,648,648 B2 * | 2/2014 | Choi | ........................ G05F 3/30 323/313 |
| 9,190,961 B1 | 11/2015 | Wan et al. | |
| 2014/0253205 A1 | 9/2014 | Wang | |

* cited by examiner

*Primary Examiner* — Joseph Lauture  
(74) *Attorney, Agent, or Firm* — IP & T Group LLP (57) ABSTRACT

A bias generator may include: an operational amplifier, a resister string, and a control circuit. The operational amplifier includes a first input terminal suitable for receiving a bandgap reference voltage, a second input terminal with an offset voltage and an output terminal. The resister string includes at least one resister coupled between a ground terminal and the output terminal of the operational amplifier, suitable for generating bias voltages. The control circuit is coupled between the second input terminal and the resister string, swaps the offset voltage, and selectively provides the offset voltage and the swapped offset voltage to the second input terminal of the operational amplifier.

15 Claims, 12 Drawing Sheets

APPARATUS FOR CORRECTING GAIN ERROR OF ANALOG-TO-DIGITAL CONVERTER

CROSS-REFERENCE TO RELATED APPLICATIONS

This application claims the benefit of U.S. Provisional Application No. 62/161,034 filed May 13, 2015, the entire contents of which are incorporated herein by reference.

BACKGROUND

1. Field

Exemplary embodiments of the present disclosure relate to a gain error correction scheme in an analog-to-digital converter.

2. Description of the Related Art

Analog-to-digital converter (ADC) system such as a successive-approximation-resister (SAR) ADC and a sigma-delta ADC may be used in many modern system-on-chip (SOC) designed. However, such type of ADC may have a gain error due to several factors.

SUMMARY

Embodiments of the present disclosure are directed to a gain error correction apparatus for analog-to-digital converter system.

Aspects of the invention include a bias generator including: an operational amplifier, a resister string, and a control circuit. The operational amplifier includes a first input terminal suitable for receiving a bandgap reference voltage, a second input terminal with an offset voltage and an output terminal. The resister string includes at least one resister coupled between a ground terminal and the output terminal of the operational amplifier, suitable for generating bias voltages. The control circuit is coupled between the second input terminal and the resister string, swaps the offset voltage, and selectively or alternatively provides the offset voltage and the swapped offset voltage to the second input terminal of the operational amplifier.

Other aspects of the invention include an apparatus including: an analog-to-digital converter (ADC) and a bias generator including an operational amplifier, a resister string, and a control circuit. The operational amplifier includes a first input terminal suitable for receiving a bandgap reference voltage, a second input terminal with an offset voltage and an output terminal. The resister string includes at least one resister coupled between a ground terminal and the output terminal of the operational amplifier, suitable for generating bias voltages. The control circuit is coupled between the second input terminal and the resister string, swaps the offset voltage, and selectively or alternatively provides the offset voltage and the swapped offset voltage to the second input terminal of the operational amplifier.

Further aspects of the invention include a method for operating a bias generator including an operational amplifier having a first input terminal suitable for receiving a bandgap reference voltage, a second input terminal with an offset voltage and an output terminal, and a resister string including at least one resister coupled between a ground terminal and the output terminal of the operational amplifier. The method may include: swapping the offset voltage; and selectively or alternatively providing the offset voltage and the swapped offset voltage to the second input terminal of the operational amplifier.

Still further aspects of the invention include a method for operating an analog-to-digital converter (ADC) provided bias voltages from a bias generator including an operational amplifier having a first input terminal suitable for receiving a bandgap reference voltage, a second input terminal with an offset voltage and an output terminal, and a resister string including at least one resister coupled between a ground terminal and the output terminal of the operational amplifier. The method may include: receiving, from the bias generator, a first bias voltage, generated based on the offset voltage in response to a first swap control signal; and receiving, from the bias generator, a second bias voltage generated based on the swapped offset voltage in response to a second swap control signal.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Successive-Approximation-Resister (SAR) Analog-to-Digital Converter (ADC) is a popular circuit architecture used in many modern system-on-chip (SOC) designs. The SAR ADC is suitable for high-resolution, medium speed, and low power application, due to its simplicity. The SAR ADC could be used to measure the on-chip or off-chip temperatures, power supply voltages, as well as any external sensor data.

Figure 1:
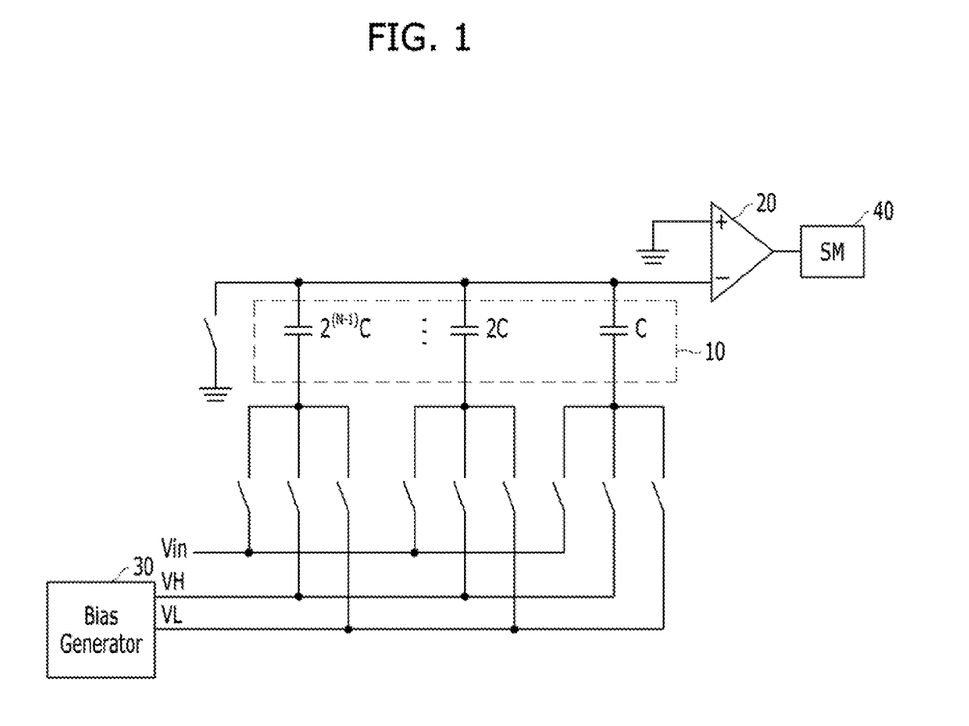
FIG. 1 is a diagram illustrating a successive-approximation-resister (SAR) analog-to-digital converter (ADC) system.

FIG. 1 is a diagram illustrating one implementation of the SAR ADC system.

Referring to FIG. 1, the SAR ADC system includes a capacitor array 10 including a plurality of capacitors (e.g., C, 2C, $2^{(N-1)}$C for an N-bit ADC), a comparator 20, a bias generator (or a reference voltage generator) 30, and a digital state-machine (SM) 40. The capacitor array 10, the comparator 20, and the SM 40 functions as the SAR ADC. The bias generator 30 provides two bias voltages VH and VL for the SAR ADC.

Figure 2:
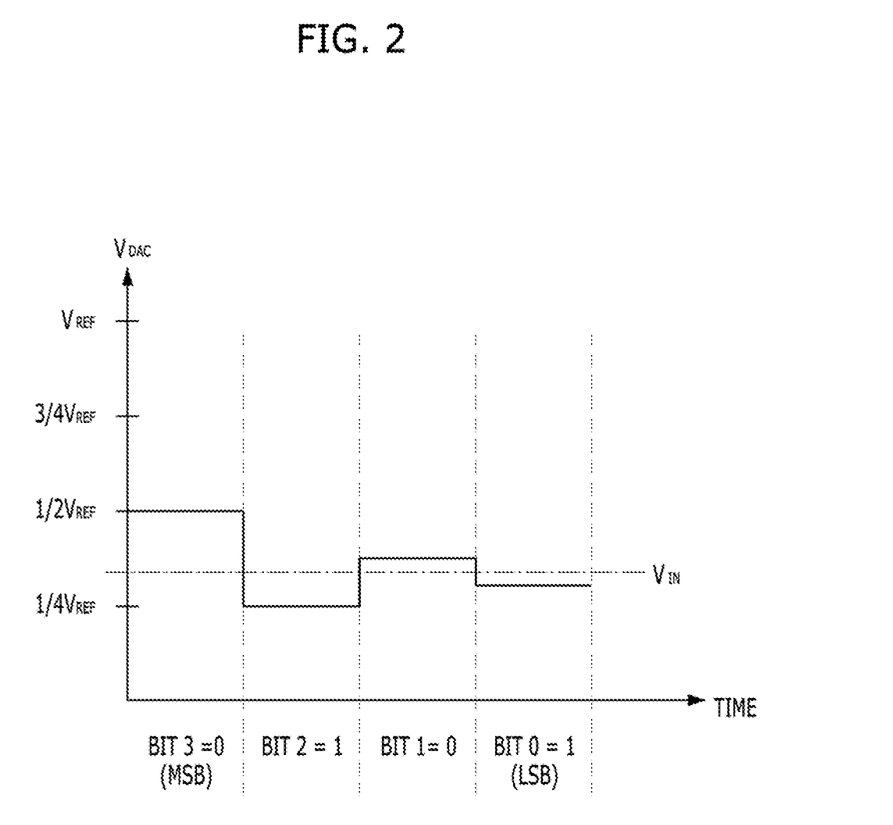
FIG. 2 is a diagram illustrating an example of 4-bit SAR iteration.

The input voltage Vin is first captured onto the capacitor array 10. In the subsequent comparison phases, either VH or VL is charged into to the selected bit-position capacitor, in the sequence from high to low bits successively, until all bits are examined. An example of a 4-bit SAR iteration over time is shown in FIG. 2.

The ADC full range may be ±(VH−VL), assuming VH>VL. The output of an N-bit ADC can be expressed as: Dout=Q[$2^{(N-1)}$*Vin/(VH−VL)], where Q( ) represents the quantization function (e.g., the "round( )" function).

Figure 3:
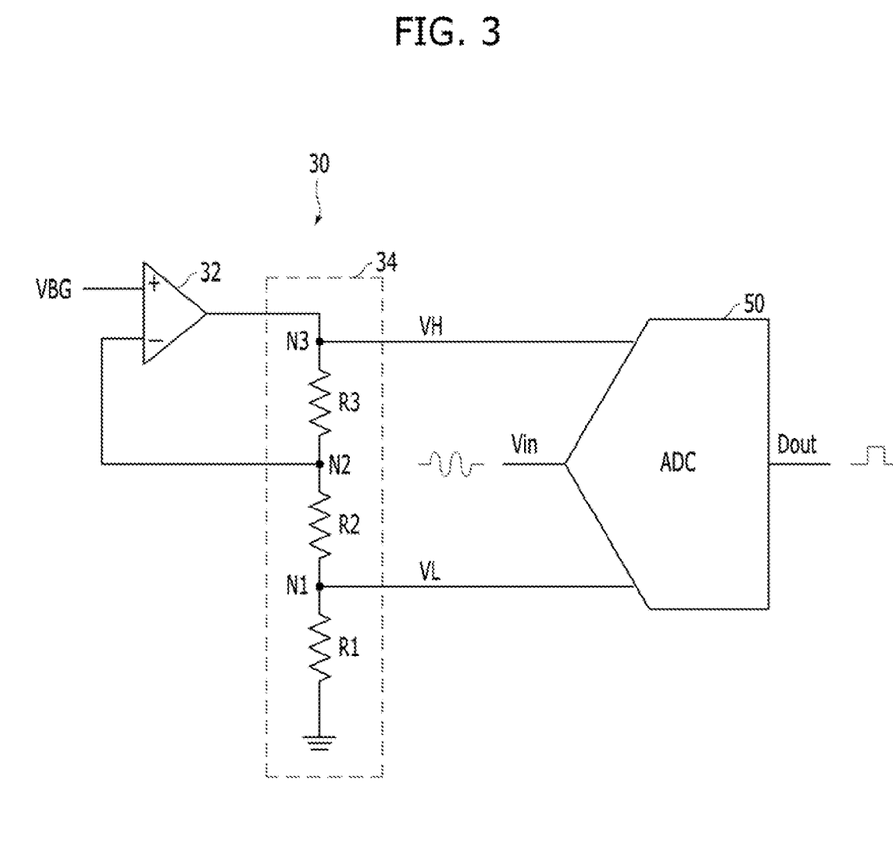
FIG. 3 is a diagram illustrating a bias generator for an analog-to-digital converter (ADC).

FIG. 3 is a diagram illustrating a bias generator for an analog-to-digital converter (ADC) 50. For example, the bias generator of FIG. 3 may be the bias generator 30 in FIG. 1.

Referring to FIG. 3, the bias generator 30 includes an operational amplifier 32, and a resister string 34.

The operational amplifier 32 includes a first input terminal suitable for receiving a bandgap voltage VBG, a second input terminal and an output terminal.

The resister string 34 includes at least one resister (e.g., 3 resisters for simplicity) coupled between a ground terminal and the output terminal of the operational amplifier 32. The resister string 34 generates bias voltages for the ADC 50. For example, the resister string 34 generates a low bias voltage VL, a medium bias voltage VM and a high bias voltage VH.

The resister string 34 includes a first resister R1 to a third resister R3. The first resister R1 is coupled between the ground terminal and a first node N1 for outputting the low bias voltage VL. The second resister R2 is coupled between the first node N1 and a second node N2 for outputting the medium bias voltage VM. The third resister R3 is coupled between the second node N2 and a third node N3 for outputting the high bias voltage VH. The third node N3 is coupled to the output terminal of the operational amplifier 32.

The ADC 50 performs an analog-to-digital conversion to output Dout. For this, the ADC 50 is provided with input voltage Vin and bias voltages VH and VL from the bias generator 30. For example, if the ADC 50 is a SAR ADC, the ADC 50 may include the capacitor array 10, the comparator 20, and the SM 40 in shown in FIG. 1.

The following equations describe the bias generation and the ADC:

$$Vref = VH - VL = VBG \cdot \frac{R2 + R3}{R1 + R2} \quad (1)$$

$$Dout = Q\left[2^{N-1} \cdot \frac{Vin}{Vref}\right]$$

$$ADC\_Range \cong -Vref : Vref$$

In the equation (1), the ADC gain Dout/Vin is a function of Vref (=VH−VL). Several factors can affect the accuracy of Vref: The accuracy of the VBG (bandgap voltage), the resister matching, and the offset voltage of the operational amplifier. The offset voltage of the operational amplifier OpAmp may be the major contributor of Vref variations, since the bandgap voltage is relatively stable, and the resister matching is usually very good in most integrated circuit (IC) processes.

Figure 4:
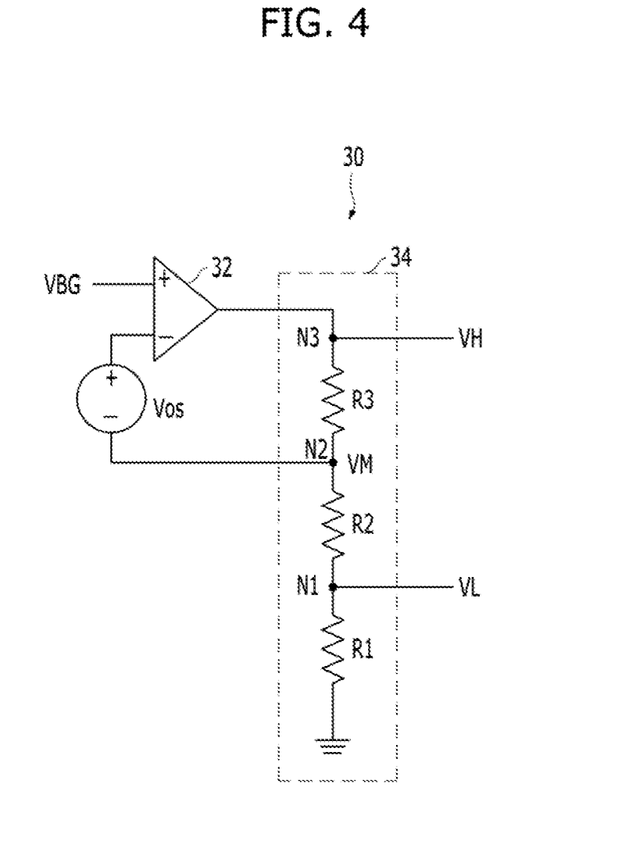
FIG. 4 is a diagram illustrating an effect of an input offset voltage in an operational amplifier on a reference voltage by a bias generator.

FIG. 4 illustrates the input offset voltage Vos of the OpAmp and its effect on the reference voltage Vref in the bias generator 30 of FIG. 3.

It can be shown the Vref is:

$$Vref = VH - VL = (VBG - Vos) \cdot \frac{R2 + R3}{R1 + R2} \quad (2)$$

Figure 5:
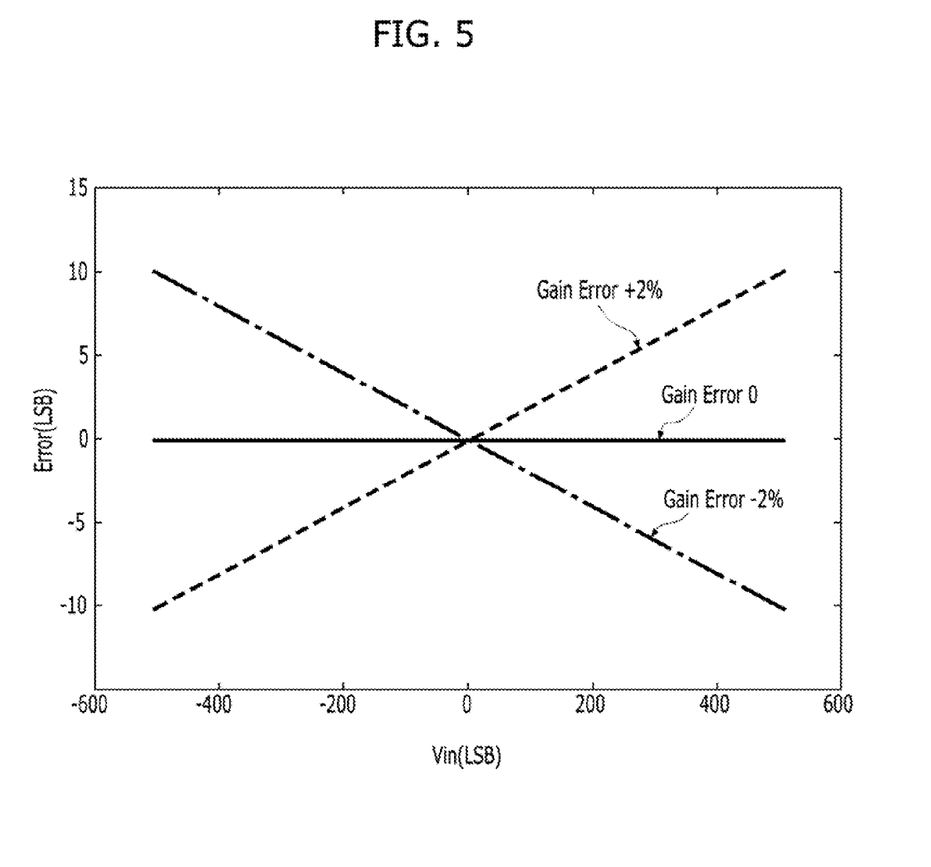
FIG. 5 is a diagram illustrating gain errors of a 10-bit successive-approximation-resister (SAR) analog-to-digital converter (ADC).

The polarity of the offset voltage Vos can be either positive or negative, and the variation of the reference voltage Vref can cause the ADC gain error, which is ±Vos/VBG. One example is shown in FIG. 5. It is evident that the ADC error is proportional to its gain error (e.g., ±2%), and the deviation grows as the input voltage Vin deviates from zero (or differential zero for differential implementations).

Figure 6:
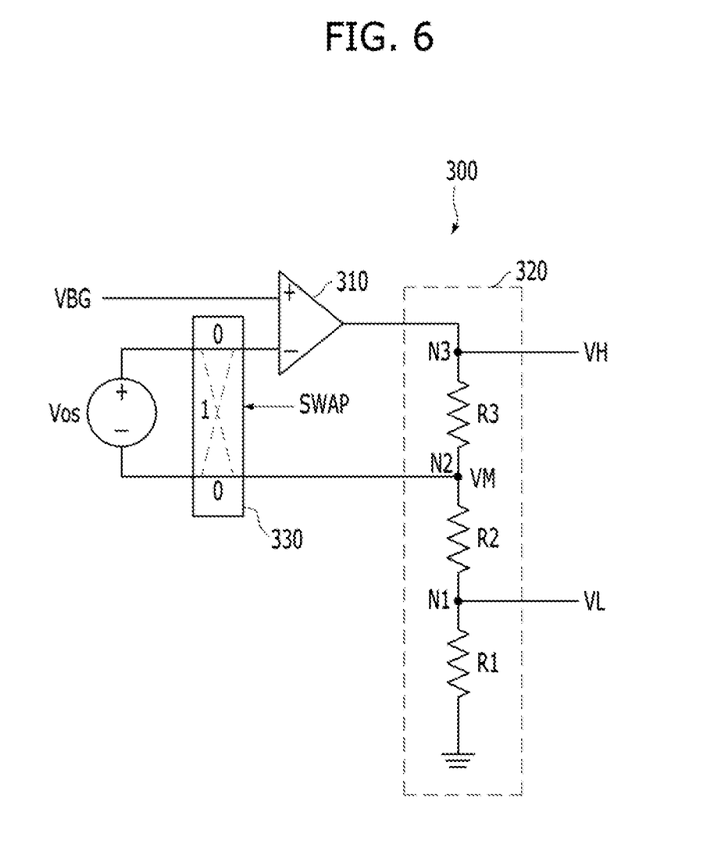
FIG. 6 is a diagram illustrating a bias generator for an analog-to-digital converter (ADC) in accordance with an embodiment.

FIG. 6 is a diagram illustrating a bias generator 300 for an analog-to-digital converter (ADC) in accordance with an embodiment. For example, the bias generator 300 of FIG. 6 may be the bias generator 30 in FIG. 1.

Referring to FIG. 6, the bias generator 300 includes an operational amplifier 310, a resister string 320 and a control circuit 330.

The operational amplifier 310 includes a first input terminal (+), i.e., a non-inverting terminal, suitable for receiving a bandgap voltage VBG, a second input terminal (−), i.e., an inverting terminal, and an output terminal.

The resister string 320 includes at least one resister (e.g., 3 resisters for simplicity) coupled between a ground terminal and the output terminal of the operational amplifier 310. The resister string 320 generates bias voltages for the ADC. For example, the resister string 320 generates a low bias voltage VL, a medium bias voltage VM and a high bias voltage VH. The low bias voltage VL and the high bias voltage VH may be provided as the bias voltages for the ADC.

The resister string 320 includes a first resister R1 to a third resister R3. The first resister R1 is coupled between the ground terminal and a first node N1 for outputting the low bias voltage VL. The second resister R2 is coupled between the first node N1 and a second node N2 for outputting the medium bias voltage VM. The third resister R3 is coupled between the second node N2 and a third node N3 for outputting the high bias voltage VH. The third node N3 is coupled to the output terminal of the operational amplifier 310.

The control circuit 330 is coupled between the second input terminal of the operational amplifier 310 and the resister string 320. The control circuit 330 swaps the offset voltage Vos, and provides the offset voltage Vos and the swapped offset voltage to the second input terminal of the operational amplifier 310 alternatively or selectively.

In some embodiments, the control circuit 330 provides the offset voltage Vos to the second input terminal of the operational amplifier 310 in response to a first swap control signal (SWAP=0), and provides the swapped offset voltage to the second input terminal of the operational amplifier 310 in response to a second swap control signal (SWAP=1).

If it can swap the Vos polarity and run the ADC with the positive Vos first, and then with the negative Vos again, then take the average afterward, then the Vos effect should cancel out as described in the following equation:

$$Vref_{SWAP=0} = VH - VL = (VBG - Vos) \cdot \frac{R2 + R3}{R1 + R2} \quad (3)$$

$$Vref_{SWAP=1} = VH - VL = (VBG + Vos) \cdot \frac{R2 + R3}{R1 + R2}$$

$$Vref = \frac{1}{2} \cdot (Vref_{SWAP=0} + Vref_{SWAP=1}) = VBG \cdot \frac{R2 + R3}{R1 + R2}$$

In the equation (3), the first equation represents Vref for SWAP=0, the second equation represents Vref for SWAP=1, and the third equation represents the average for Vref for SWAP=0 and Vref for SWAP=1, which is Vos free.

Figure 7A:
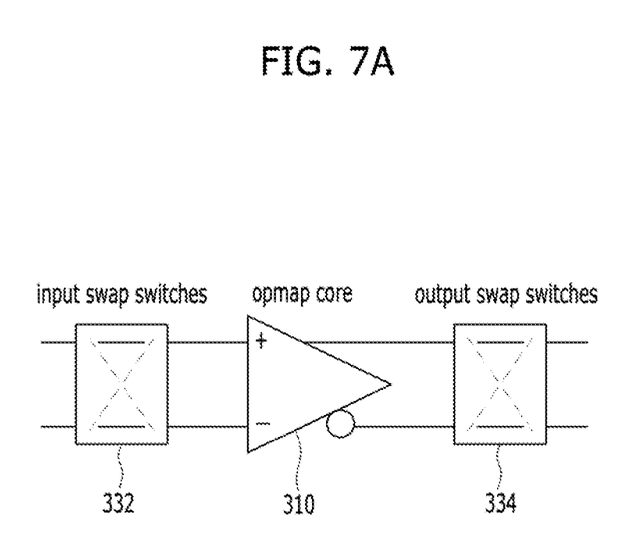
FIGS. 7A and 7B are diagrams illustrating some elements of a bias generator for an analog-to-digital converter (ADC) in accordance with an embodiment.
Figure 7B:
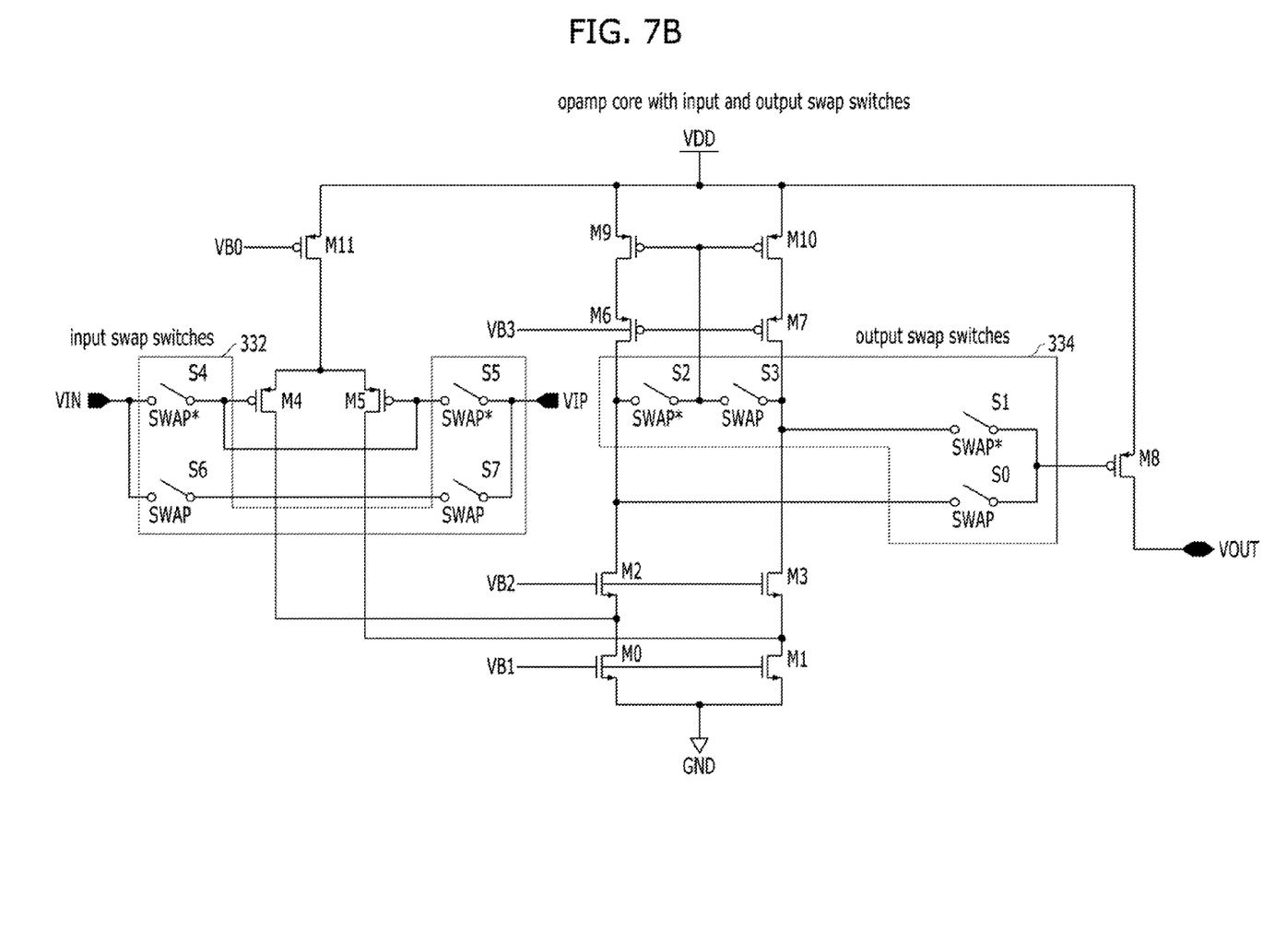

FIGS. 7A and 7B are diagrams illustrating a circuit including some elements of a bias generator for an analog-to-digital converter (ADC) in accordance with an embodiment. For example, the circuit of FIGS. 7A and 7B may include the control circuit 330 in FIG. 6.

Referring to FIG. 7A, the control circuit 330 may include an input swap switch circuit 332 connected to inputs of the operational amplifier 310 and an output swap switch circuits 334 connected to outputs of the operational amplifier 31. Referring to FIG. 7B, the bias generator 300 may include a voltage input terminal VIN, a voltage output terminal VOUT, a bandgap voltage input terminals VB0 to VB3, a plurality of transistors M0 to M11 and a plurality of switches S0 to S7 contained in the control circuit 330.

The switches includes two sets (or group) of switches: S0-S3 for its output path, and S4-S7 for its input path. Every switch is labeled with "SWAP" or "SWAP*", which indicates that only half of the switches are connected at a time. For example, when SWAP=0 (i.e., in response to a first swap control signal), only the switches S1, S2, S4 and S5 are turned on, while the others S0, S3, S6 and S7 are turned off. When SWAP=1 (i.e., in response to a second swap control signal), only the switches S1, S2, S4 and S5 are turned off, while the others S0, S3, S6 and S7 are turned on. Although the Vos was not explicitly spelled out in FIG. 7, it may be mostly from transistor M4, M5, M0, M1, and M9, M10, due to transistor random mismatches.

Figure 8A:
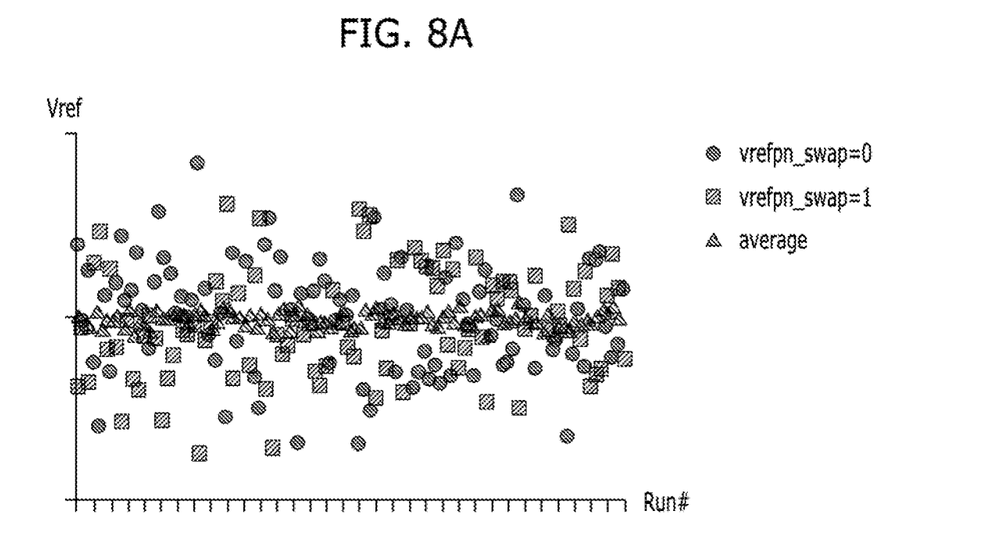
FIGS. 8A and 8B are diagrams illustrating Monte Carlo simulations of the circuit of FIG. 7.
Figure 8B:
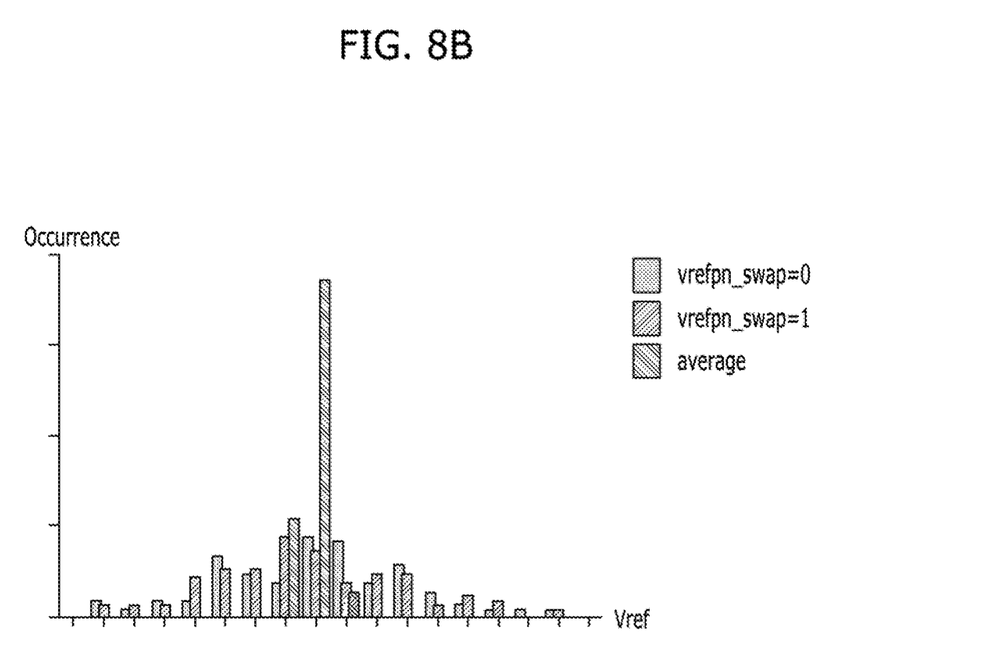

FIGS. 8A and 8B are diagrams illustrating Monte Carlo simulations of the circuit of FIG. 7.

Referring to FIGS. 8A and 8B, the variations of the reference voltage Vref (i.e., vrefpn in FIGS. 8A and 8B) were caused by transistor random mismatches as shown in FIG. 7. In each run, the offset voltage Vos were approximate equal but opposite in sign, between SWAP=0 and SWAP=1 (in FIG. 6). As a result, the average of the reference voltages Vref (i.e., vrefpn_swap=0 and vrefpn_swap=1) was able to reduce the offset voltage Vos.

In this disclosure, an offset cancellation scheme is proposed to reduce the SAR ADC gain error. By swapping the Vos polarities as shown in FIG. 6 and FIG. 7B, the ADC gain errors caused by the offset voltage Vos in the operational amplifier OpAmp can be averaged in two consecutive conversions, and the net result can be visualized in FIG. 10, and be also predicted in the equation (3).

Figure 9A:
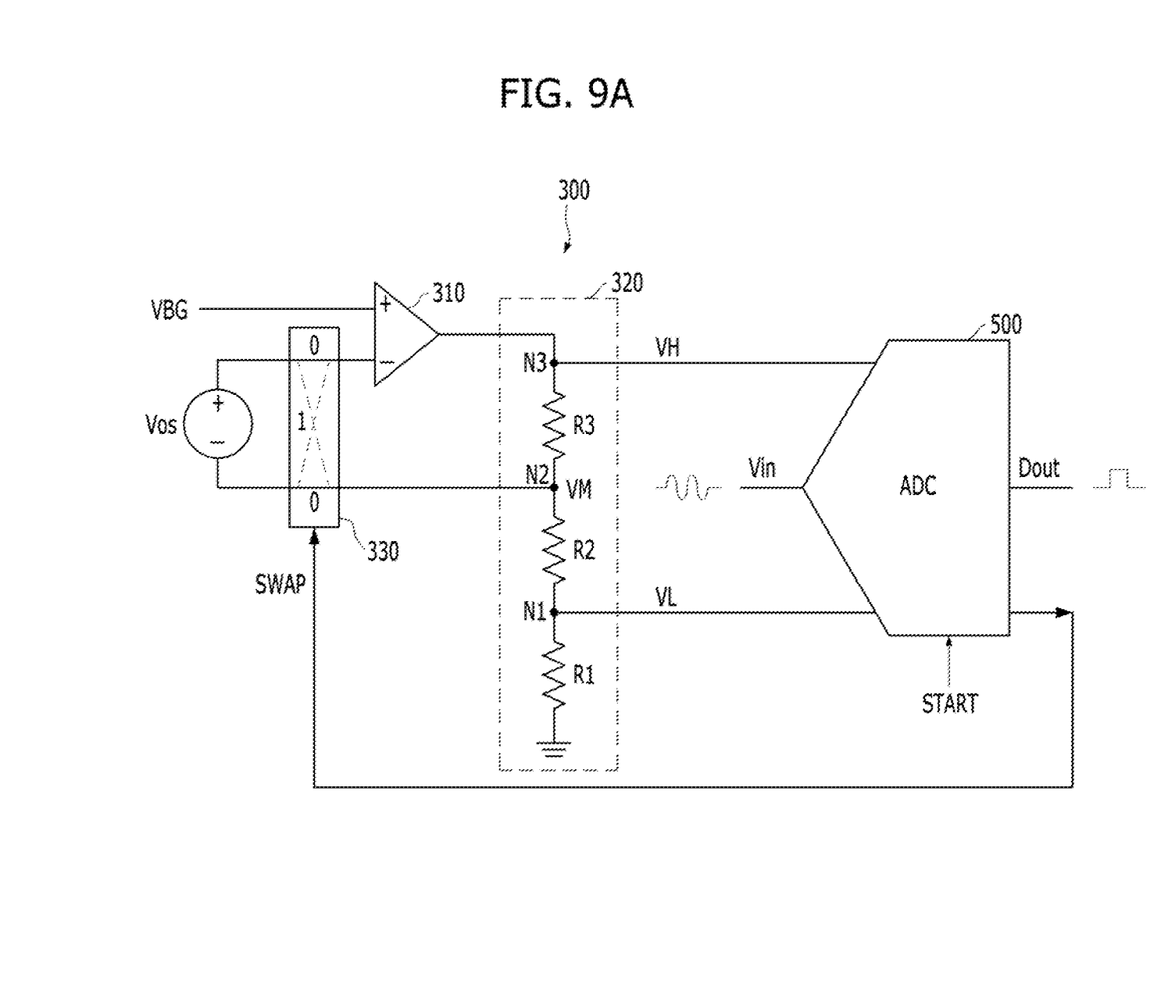
FIGS. 9A and 9B are a diagram illustrating an analog-to-digital converter (ADC) system and a timing diagram representing the operation of the ADC system in accordance with an embodiment.
Figure 9B:
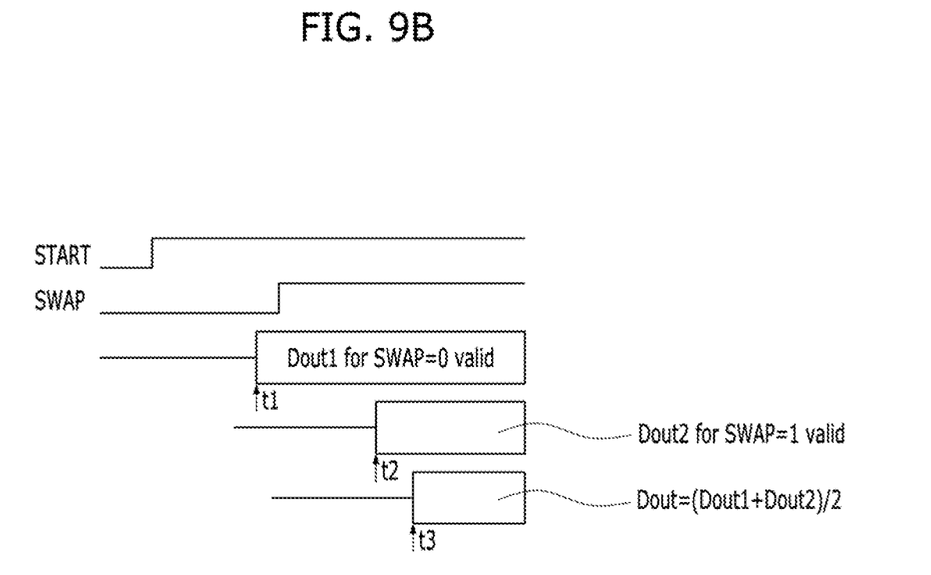

FIGS. 9A and 9B are a diagram illustrating an analog-to-digital converter (ADC) system and a diagram showing the operation of the ADC system in accordance with an embodiment.

Referring to FIG. 9A, the ADC system includes an analog-to-digital converter (ADC) 500 and a bias generator 300 for providing bias voltages to the ADC 500.

The ADC 500 performs an analog-to-digital conversion to output Dout. For this, the ADC 500 is provided with input voltage Vin and bias voltages VH and VL from the bias generator 300. The ADC 500 may be one of a SAR ADC and a sigma-delta ADC. For example, if the ADC 500 is the SAR ADC, the ADC 500 may include the capacitor array 10, the comparator 20, and the SM 40 in shown in FIG. 1.

As shown in FIG. 9A, the bias generator 300 includes an operational amplifier 310, a resister string 320 and a control circuit 330.

The operational amplifier 310 includes a first input terminal (+) (i.e., a non-inverting terminal) suitable for receiving a bandgap voltage VBG, a second input terminal (−) (i.e., an inverting terminal) and an output terminal.

The resister string 320 includes at least one resister (e.g., 3 resisters for simplicity) coupled between a ground terminal and the output terminal of the operational amplifier 310. The resister string 320 generates bias voltages for the ADC 500. For example, the resister string 320 generates a low bias voltage VL, a medium bias voltage VM and a high bias voltage VH. The low bias voltage VL and the high bias voltage VH may be provided as the bias voltages for the ADC.

The resister string 320 includes a first resister R1 to a third resister R3. The first resister R1 is coupled between the ground terminal and a first node N1 for outputting the low bias voltage VL. The second resister R2 is coupled between the first node N1 and a second node N2 for outputting the medium bias voltage VM. The third resister R3 is coupled between the second node N2 and a third node N3 for outputting the high bias voltage VH. The third node N3 is coupled to the output terminal of the operational amplifier 310.

The control circuit 330 is coupled between the second input terminal of the operational amplifier 310 and the resister string 320. The control circuit 330 swaps the offset voltage Vos, and provides the offset voltage Vos and the swapped offset voltage to the second input terminal of the operational amplifier 310 alternatively.

Referring to FIG. 9B, in some embodiments, the ADC 500 receives a start signal START and generates a swap control signal SWAP to control the control circuit 330. The control circuit 330 provides the offset voltage Vos to the second input terminal of the operational amplifier 310 in response to a first swap control signal (SWAP=0), and provides the swapped offset voltage to the second input terminal of the operational amplifier 310 in response to a second swap control signal (SWAP=1).

After the start signal START goes high, the control signal SWAP is low initially. At time=t1, in response to SWAP=0, the first ADC sample Dout1 becomes valid. The control signal SWAP is then set to high for the $2^{nd}$ conversion. At time=t2, in response to SWAP=1, the second ADC sample Dout2 becomes valid. At time=t3, the ADC 200 takes average both the first ADC sample Dout1 and the second ADC sample Dout2. That is, the average sample Dout=(Dout1+Dout2)/2 is valid. Another conversion can be repeated after t3 in the same fashion.

Figure 10A:
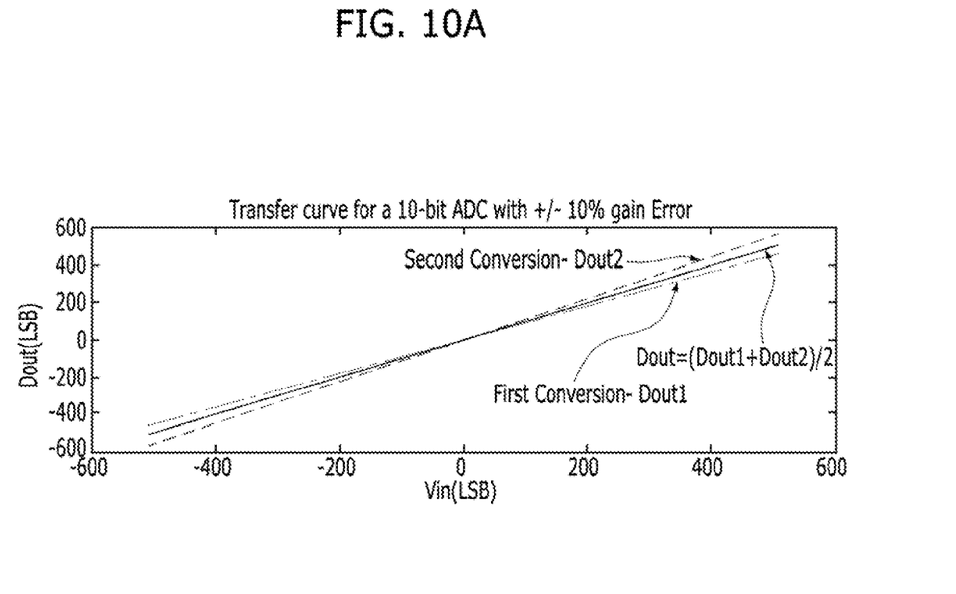
FIGS. 10A and 10B are diagrams illustrating simulation results for an analog-to-digital converter (ADC) system in accordance with an embodiment.
Figure 10B:
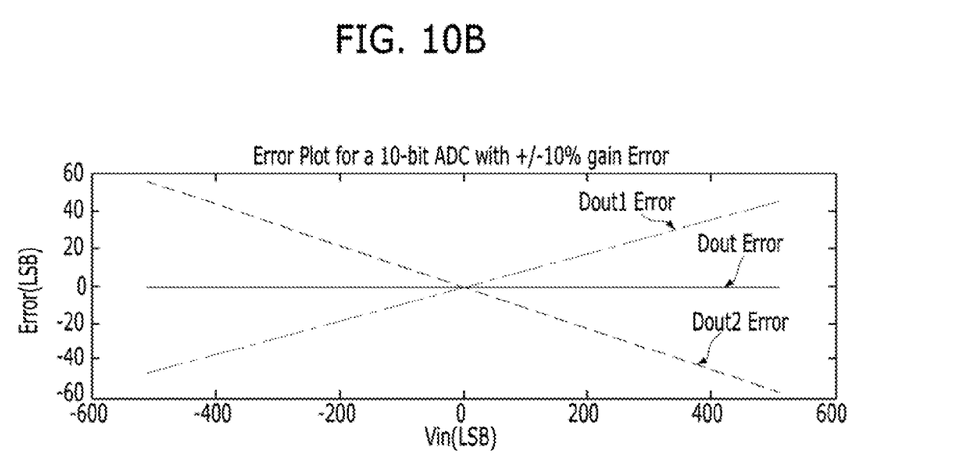

FIGS. 10A and 10B are diagrams illustrating simulation results for an analog-to-digital converter (ADC) system in accordance with an embodiment.

The simulation results for Dout versus Vin sweep for a particular Vos are shown in FIG. 10A. The particular Vos represents a SAR ADC with some random offset. The intermediate results both Dout1 and Dout2 are deviated from ideal Dout, but symmetrically. After taking average, Dout shows no gain error shown in FIG. 10B.

As described above, embodiments of this disclosure provide a scheme to reduce the ADC gain error through an input offset voltage cancellation for an operational amplifier. Although it is described that the control operation such as the generation of the control signal SWAP is performed by the ADC, it should be noted that various implementations are possible. For example, the control operation may be performed by a firmware via an embedded central processing unit (CPU) to control the control signal SWAP, launch conversions and perform the subsequent average. Furthermore, the described gain error correction method may be applied in ADC systems, such as the SAR ADC as well as the sigma-delta ADC, which is often based on switched capacitor design with reference generation in a similar fashion.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A bias generator comprising:
an operational amplifier including a first input terminal suitable for receiving a bandgap reference voltage, a second input terminal with an offset voltage and an output terminal;
a resister string including at least one resister coupled between a ground terminal and the output terminal of the operational amplifier, suitable for generating bias voltages; and
a control circuit coupled between the second input terminal and the resister string, suitable for swapping the offset voltage, and selectively providing the offset voltage and a swapped offset voltage to the second input terminal of the operational amplifier in accordance with a swap control signal, wherein the swapped offset voltage and the offset voltage have a same voltage value with opposite polarities.

2. The bias generator of claim 1, wherein the bias voltages include a low bias voltage and a high bias voltage.

3. The bias generator of claim 2, wherein the resister string includes:
a first resister coupled between the ground terminal and a first node for outputting the low bias voltage;
a second resister coupled between the first node and a second node; and
a third resister coupled between the second node and a third node for outputting the high bias voltage, the third node coupled to the output terminal of the operational amplifier.

4. The bias generator of claim 3, wherein the control circuit includes:
a first group of switches suitable for providing the offset voltage to the second input terminal in response to a first swap control signal; and
a second group of switches suitable for providing the swapped offset voltage to the second input terminal in response to a second swap control signal.

5. An apparatus comprising:
an analog-to-digital converter (ADC); and
a bias generator suitable for providing bias voltages to the ADC, comprising:
an operational amplifier including a first input terminal suitable for receiving a bandgap reference voltage, a second input terminal with an offset voltage and an output terminal;
a resister string including at least one resister coupled between a ground terminal and the output terminal of the operational amplifier, suitable for generating the bias voltages; and
a control circuit coupled between the second input terminal and the resister string, suitable for swapping the offset voltage, and selectively providing the offset voltage and a swapped offset voltage to the second input terminal of the operational amplifier in accordance with a swap control signal, wherein the swapped offset voltage and the offset voltage have a same voltage value with opposite polarities.

6. The apparatus of claim 5, wherein the bias voltages include a low bias voltage and a high bias voltage.

7. The apparatus of claim 6, wherein the resister string includes:
a first resister coupled between the ground terminal and a first node for outputting the low bias voltage;
a second resister coupled between the first node and a second node; and
a third resister coupled between the second node and a third node for outputting the high bias voltage, the third node coupled to the output terminal of the operational amplifier.

8. The apparatus of claim 7, wherein the control circuit includes:
a first group of switches suitable for providing the offset voltage to the second input terminal in response to a first swap control signal; and
a second group of switches suitable for providing the swapped offset voltage to the second input terminal in response to a second swap control signal.

9. The apparatus of claim 5, wherein the ADC includes one of a successive-approximation-resister ADC and a sigma-delta ADC.

10. A method for operating a bias generator including an operational amplifier having a first input terminal suitable for receiving a bandgap reference voltage, a second input terminal with an offset voltage and an output terminal, and a resister string including at least one resister coupled between a ground terminal and the output terminal of the operational amplifier, comprising:

swapping the offset voltage; and selectively providing the offset voltage and a swapped offset voltage to the second input terminal of the operational amplifier in accordance with a swap control signal, wherein the swapped offset voltage and the offset voltage have a same voltage value with opposite polarities.

11. The method of claim 10, wherein the bias voltages include a low bias voltage and a high bias voltage.

12. The method of claim 11, wherein providing the offset voltage and the swapped offset voltage to the second input terminal of the operational amplifier alternatively comprises providing the offset voltage to the second input terminal in response to a first swap control signal, and providing the swapped offset voltage to the second input terminal in response to a second swap control signal.

13. A method for operating an analog-to-digital converter (ADC) provided bias voltages from a bias generator including an operational amplifier having a first input terminal suitable for receiving a bandgap reference voltage, a second input terminal with an offset voltage and an output terminal, and a resister string including at least one resister coupled between a ground terminal and the output terminal of the operational amplifier, comprising:

receiving, from the bias generator, a first bias voltage, generated based on the offset voltage in response to a first swap control signal; and     receiving, from the bias generator, a second bias voltage generated based on a swapped offset voltage in response to a second swap control signal, wherein the swapped offset voltage and the offset voltage have a same voltage value and opposite polarities.

14. The method of claim 13, wherein each of the first and second bias voltages include a low bias voltage and a high bias voltage.

15. The method of claim 13, further comprising:

performing a first data output based on the first bias voltage;

performing a second data output based on the second bias voltage; and     averaging the first data output and the second data output.

\* \* \* \* \*